(12) United States Patent
Tsai et al.

(10) Patent No.: US 11,287,466 B2
(45) Date of Patent: Mar. 29, 2022

(54) CHIP TESTING CIRCUIT AND TESTING METHOD THEREOF

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS, Santa Clara, CA (US)

( * ) Notice: Subject to any disclaimer, the term of this patent is extended or adjusted under 35 U.S.C. 154(b) by 36 days.

(21) Appl. No.: 17/008,647

(22) Filed: Sep. 1, 2020

(65) Prior Publication Data
US 2021/0311109 A1    Oct. 7, 2021

(30) Foreign Application Priority Data

Apr. 1, 2020   (TW) ................................. 109111208

(51) Int. Cl.
| | |
|---|---|
| *G01R 31/28* | (2006.01) |
| *G01R 31/317* | (2006.01) |
| *G01R 31/3185* | (2006.01) |
| *G01R 31/319* | (2006.01) |
| *G01R 31/69* | (2020.01) |
| *G01R 31/52* | (2020.01) |

(52) U.S. Cl.
CPC ..... *G01R 31/2853* (2013.01); *G01R 31/2884* (2013.01); *G01R 31/31721* (2013.01); *G01R 31/31919* (2013.01); *G01R 31/31924* (2013.01); *G01R 31/318563* (2013.01); *G01R 31/52* (2020.01); *G01R 31/69* (2020.01)

(58) Field of Classification Search
CPC ............ G01R 31/2853; G01R 31/2884; G01R 31/31721; G01R 31/318563; G01R 31/31919; G01R 31/31924; G01R 31/52; G01R 31/69
USPC .................................... 324/762.01, 537, 500
See application file for complete search history.

(56) References Cited

U.S. PATENT DOCUMENTS

| | | | | |
|---|---|---|---|---|
| 2018/0218102 A1* | 8/2018 | Ledzius | .................. | G06F 30/34 |
| 2019/0050352 A1* | 2/2019 | Yun | ..................... | G06F 13/1689 |
| 2021/0132142 A1* | 5/2021 | Tsai | .................... | G01R 31/2874 |

FOREIGN PATENT DOCUMENTS

| | | |
|---|---|---|
| CN | 101630238 A | 1/2010 |
| CN | 103245869 A | 8/2013 |

(Continued)

*Primary Examiner* — Giovanni Astacio-Oquendo
(74) *Attorney, Agent, or Firm* — Li & Cai Intellectual Property Office

(57) ABSTRACT

A chip testing circuit and a testing method thereof are provided. The chip testing circuit includes a parameter measurement circuit, a plurality of power supply circuits, a plurality of switch circuits, and a control circuit. The plurality of power supply circuits respectively provide power supply to a plurality of chips carried by a plurality of sockets. Each switch circuit is electrically connected between one socket and one power supply circuit. The control circuit is connected in parallel to a plurality of signal pins of the plurality of chips carried by the plurality of sockets, so that when the control circuit outputs test data, all the chips can simultaneously receive the test data. When executing a parametric test mode, the control circuit controls one of the switch circuits to be turned on and controls the parameter measurement circuit to perform an electrical performance test on the chips.

19 Claims, 14 Drawing Sheets

(56) References Cited

FOREIGN PATENT DOCUMENTS

| CN | 206804777 U | 12/2017 |
|----|-------------|---------|
| TW | 201017188 A | 5/2010 |

\* cited by examiner

CHIP TESTING CIRCUIT AND TESTING METHOD THEREOF

CROSS-REFERENCE TO RELATED PATENT APPLICATION

This application claims the benefit of priority to Taiwan Patent Application No. 109111208, filed on Apr. 1, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a test circuit, and more particularly to a chip testing circuit for testing a memory and a method thereof.

BACKGROUND OF THE DISCLOSURE

Before leaving the factory, memories generally need to pass a high temperature test and a burn-in test, or high temperature, burn-in and low temperature tests. When an existing memory testing apparatus performs a parametric test or a burn-in test, in order to test a large number of memories, the quantity of pins required by the memory testing apparatus are drastically increased. As a result, the memory testing apparatus often has a large size and high power consumption.

SUMMARY OF THE DISCLOSURE

In response to the above-referenced technical inadequacies, the present disclosure provides a chip testing circuit and a testing method thereof, which can effectively reduce the requisite number of pins.

The embodiments of the present disclosure disclose a chip testing circuit which is adapted for testing a plurality of chips carried by a plurality of sockets. The chip testing circuit includes a parameter measurement circuit, a plurality of power supply circuits, a plurality of switch circuits, and a control circuit. The parameter measurement circuit is used to perform an electrical performance test on the plurality of chips carried by the plurality of sockets. The plurality of power supply circuits are electrically connected to the plurality of sockets respectively, and is used to supply power to the plurality of chips carried by the plurality of sockets, where any of the power supply circuits is individually connected to one of the sockets. The plurality of switch circuits is electrically connected between the plurality of sockets and the plurality of power supply circuits, and any of the switch circuits is electrically connected between one of the sockets and one of the power supply circuits. The control circuit is used to control operations of the parameter measurement circuit and the plurality of power supply circuits, and is connected in parallel to a plurality of signal pins of the plurality of chips carried by the plurality of sockets, so that after the control circuit outputs test data, the chips can simultaneously receive the test data. When executing a parametric test mode, the control circuit controls one of the switch circuits to be turned on, and then controls the parameter measurement circuit to perform an electrical performance test on one of the plurality of chips connected to the switch circuit that is turned on.

The embodiments of the present disclosure further disclose a chip testing method, applicable to testing a plurality of chips carried by a plurality of sockets, where the plurality of sockets is electrically connected to a plurality of power supply circuits, respectively, any of the power supply circuits being individually connected to one of the sockets; a plurality of switch circuits is electrically connected between the plurality of sockets and the plurality of power supply circuits, any of the switch circuits being electrically connected between one of the sockets and one of the power supply circuits; and a control circuit is connected in parallel to a plurality of signal pins of the plurality of chips carried by the plurality of sockets. The method includes the following steps: when executing a parametric test mode, controlling, by the control circuit, one of the switch circuits to be turned on; when one of the switch circuits is turned on, controlling, by the control circuit, a parameter measurement circuit to perform an electrical performance test on one of the plurality of chips connected to the switch circuit that is turned on; and determining, by the control circuit according to a result of the electrical performance test, whether the chip is a non-defective product or a defective product.

To sum up, the chip testing circuit and the testing method thereof disclosed by the embodiments of the present disclosure use the power supply circuits to individually supply power to a single chip, and uses a switch circuit to control a corresponding chip to acquire the power supply. In this way, when signal pins of all chips are connected in parallel, each single chip can also be controlled to acquire power supply, and an electrical performance test can be successfully performed on this chip individually, thus effectively reducing the number of test pins and further obtaining an accurate test result.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
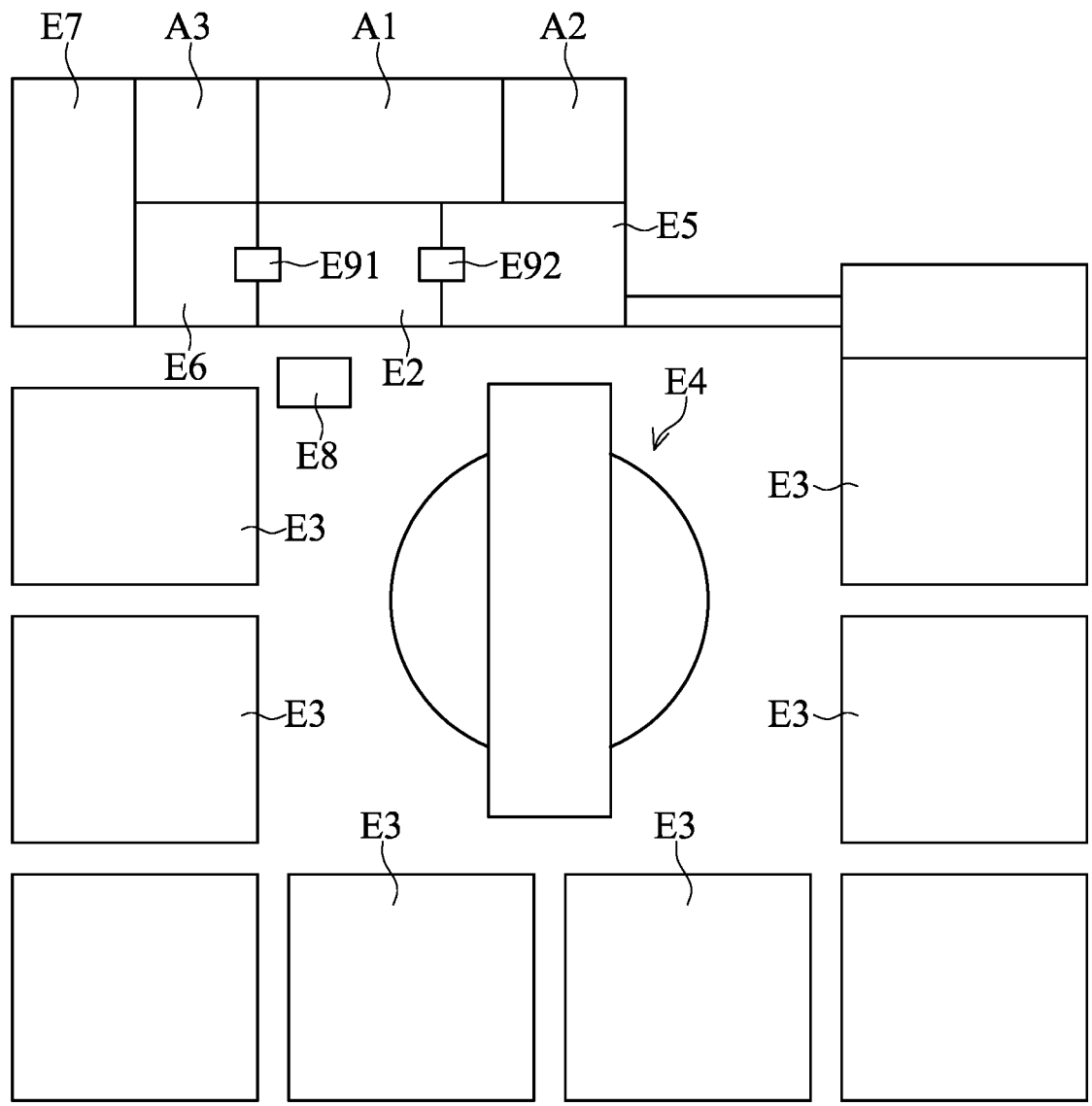
FIG. 1 is a schematic diagram of a chip testing system disclosed in an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
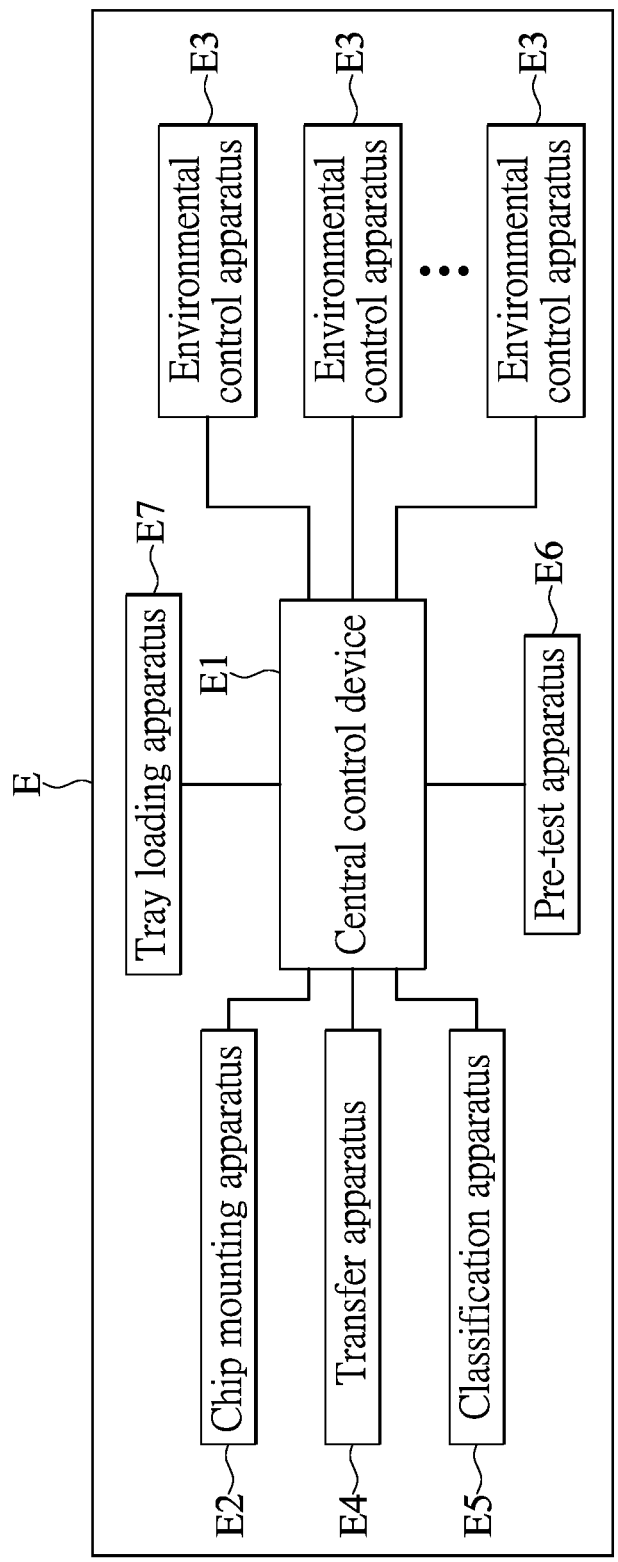
FIG. 2 is a functional block diagram of the chip testing system disclosed in an embodiment of the present disclosure.
Figure 3:
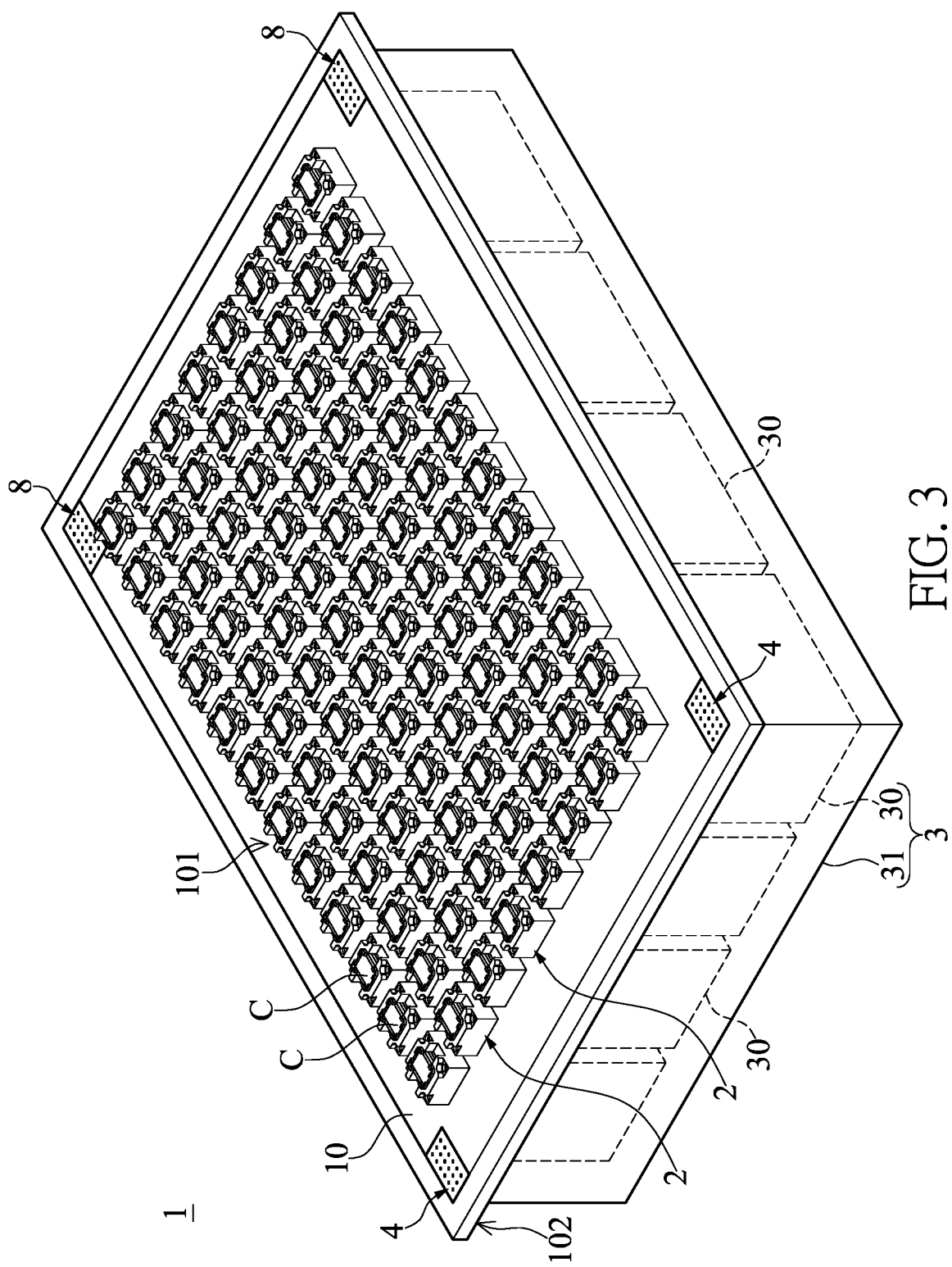
FIG. 3 is a schematic view of a chip testing device of the chip testing system disclosed in an embodiment of the present disclosure.

Referring to FIGS. 1, 2 and 3 together, FIG. 1 is a schematic diagram of a chip testing system disclosed in an embodiment of the present disclosure, FIG. 2 is a functional block diagram of the chip testing system disclosed in an embodiment of the present disclosure, and FIG. 3 is a schematic view of a chip testing device disclosed in an embodiment of the present disclosure. The chip testing system E disclosed by the present disclosure is used to test a plurality of chips C. The chip testing system E includes a central control device E1, a chip mounting apparatus E2, at least one chip testing device 1, a plurality of environmental control apparatuses E3, a transfer apparatus E4, and a classification apparatus E5.

The central control device E1 is connected to the chip mounting apparatus E2, the plurality of environmental control apparatuses E3, the transfer apparatus E4, and the classification apparatus E5. The central control device E1 can control operations of these apparatuses. The central control device E1 is, for example, a server or any of various computer apparatuses, which is not limited herein. The chip mounting apparatus E2 may include a mechanical arm (not shown in the figure) which can be controlled by the central control device E1 to take a plurality of chips C out of a tray one by one and then place them one by one onto a plurality of sockets 2 of the chip testing device 1.

Figure 4:
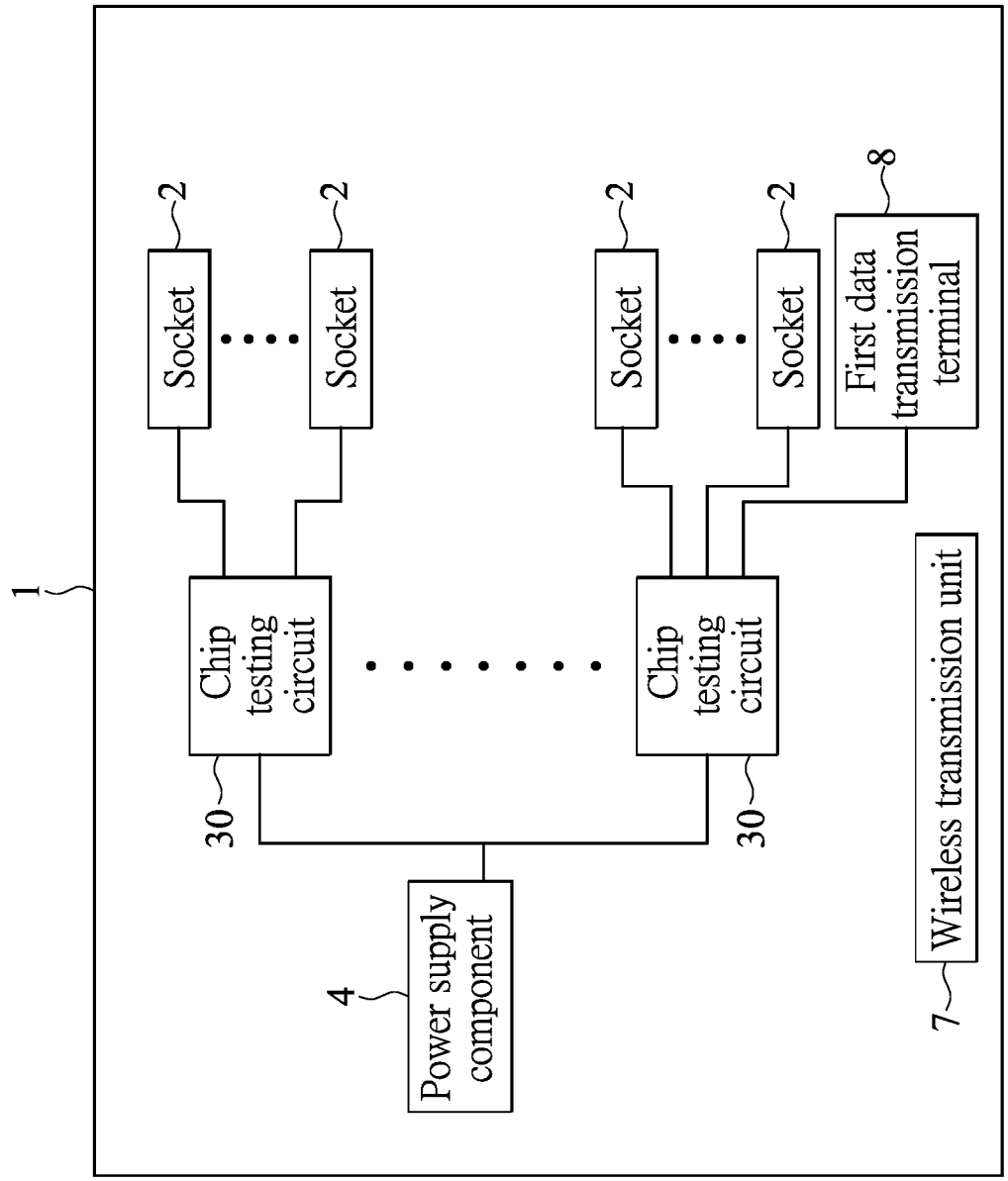
FIG. 4 is a functional block diagram of the chip testing device of the chip testing system disclosed in an embodiment of the present disclosure.

As shown in FIGS. 2, 3, and 4, FIG. 4 is a functional block diagram of the chip testing device 1. The chip testing device 1 is used to carry a plurality of chips C, and can be conveyed by the transfer apparatus E4 between a plurality of working stations (for example, the chip mounting apparatus E2, the plurality of environmental control apparatuses E3, and the classification apparatus E5).

The chip testing device 1 includes a circuit board 10, a plurality of sockets 2, a control assembly 3, and at least one power supply component 4. Two opposite sides of the circuit board 10 are respectively defined as a first lateral side 101 and a second lateral side 102. The plurality of sockets 2 is fixedly disposed on the first lateral side 101 of the circuit board 10, and each socket 2 is used to carry one chip C. The sockets 2 may vary in form according to different chips C, which is not limited herein.

In practical application, these sockets 2 may be grouped into a plurality of socket groups each including at least one socket 2. The control assembly 3 is disposed on the second lateral side 102 of the circuit board 10, and includes a plurality of chip testing circuits 30 connected to the plurality of socket groups in a one-to-one correspondence manner.

Specifically speaking, in FIG. 3 of this embodiment, the circuit board 10 is provided with, for example, ninety-six sockets 2 which may be grouped into sixteen socket groups. Each socket group includes six sockets 2, and the six sockets 2 in each socket group are connected to the same chip testing circuit 30. That is, the control assembly 3 shown in FIG. 3 may be provided with sixteen chip testing circuits 30. Therefore, the number of the sockets 2 disposed on the circuit board 10 and the number of socket groups obtained after grouping these sockets may be changed as required.

When supplied with power, each chip testing circuit 30 is able to perform a predetermined test program on the plurality of chips C disposed on the plurality of sockets 2 connected to the chip testing circuit 30. For example, the chips C may be memories of various kinds (for example, NAND flash memory and the like). Each chip testing circuit 30 is able to perform at least one of a reading test, a writing test, and an electrical performance test on each memory. In an embodiment in which the chip testing circuits 30 are used to test the memories, a specific circuit architecture of each chip testing circuit 30 will be described in detail hereinafter.

By the design in which the plurality of sockets 2 disposed on the circuit board 10 is connected to different chip testing circuits 30, signal transmission between the chip testing circuits 30 and the chips C on the sockets 2 connected thereto is faster and not easily attenuated. More specifically, if the circuit board 10 provided with ninety-six sockets 2 is connected to only one signal input source, after the signal input source sends out a signal, the signal received by sockets 2 that are distant from the signal input source may be obviously attenuated, and may result in an inaccurate chip testing result.

In practical application, all sockets 2 in each socket group may be connected in parallel, and all sockets 2 in parallel connection in the same socket group are connected to the same chip testing circuit 30. In other words, all sockets 20 connected to each chip testing circuit 30 are connected in parallel. Moreover, any socket 2 in each socket group is not connected to any socket 2 in another socket group. For example, assuming that the circuit board 10 is provided with four sockets 2: Z1, Z2, Q1, and Q2, the four sockets 2 are grouped into two socket groups, in which the first socket group includes Z1 and Z2, and the second socket group includes Q1 and Q2. Then, Z1 and Z2 are connected in parallel, and Q1 and Q2 are connected in parallel. However, Z1 and Q1 are not connected (neither in parallel nor in series), Z1 and Q2 are not connected (neither in parallel nor in series), Z2 and Q1 are not connected (neither in parallel nor in series), and Z2 and Q2 are not connected (neither in parallel nor in series).

It should be noted that, the sockets 2 may be not mutually connected between different socket groups. When the chip testing device 1 has a fault, maintenance personnel can rapidly find out the defective socket 2 by testing the socket groups one by one. Moreover, the maintenance personnel may only replace the defective socket 2, components of the defective socket 2, another socket in the same group, or the corresponding chip testing circuit 30, without the need to replace all the sockets 2 or all the chip testing circuits 30 on the whole circuit board 10.

As shown in FIG. 3, in practical application, the chip testing device 1 may further include a casing 31 which is fixedly disposed on the second lateral side 102 of the circuit board 10. The casing 31 covers a plurality of chip testing circuits 30 to protect the plurality of chip testing circuits 30. In practical application, the casing 31 may be further provided with a heat-dissipation device as required, such as a fan, heat-dissipation fins, or the like. In FIG. 3 of this embodiment, the chip testing device 1 includes only one casing 31 which covers the plurality of chip testing circuits 30. However, the number of the casings 31 of the chip testing device 1 is not limited to one. In different applications, the chip testing device 1 may also include a plurality of casings 31 and each casing 31 may cover one, two, or three chip testing circuits 30.

The power supply component 4 is disposed on and connected to the circuit board 10. The power supply component 4 may be connected to the plurality of chip testing circuits 30 via the circuit board 10. The power supply component 4 may be, for example, a board-to-board connector; and may be of, for example, a Pogo pin or a reed-like structure. However, the present disclosure is not limited thereto. FIG. 3 of this embodiment uses an example in which the power supply component 4 has a plurality of connecting terminals and is disposed on the first lateral side 101 of the circuit board 10. However, the form and the number of the power supply component 4, and the position of the power supply component 4 on the circuit board are not limited to the embodiment shown in FIG. 3.

The power supply component 4 is connected to an external power supply apparatus which can supply power to each chip testing circuit 30 via the power supply component 4. The external power supply apparatus refers to a power supply apparatus independent of the chip testing device 1, and may be any apparatus capable of providing electric power, which is not limited herein. That is to say, in a case where the chip testing device 1 is not connected to the external power supply apparatus via the power supply component 4, each chip testing circuit 30 has no electric power to perform the predetermined test program on the chips C connected to the chip testing circuit. Therefore, in different embodiments, the chip testing device 1 may be provided with at least one battery connected to the plurality of chip testing circuits 30, and the battery can supply power to these chip testing circuits 30.

In another embodiment, the power supply component 4 may include a receiving antenna. The power supply component 4 can receive electric power in a wireless manner, so as to provide the electric power to these chip testing circuits 30. In an embodiment in which the power supply component 4 includes a receiving antenna, the chip testing device 1 may include a charging battery module, and the power supply component 4 may be connected to the charging battery module. The power supply component 4 can receive electric power in a wireless manner, so as to charge the charging battery module. In a specific embodiment, electric power required by each chip testing circuit 30 to test the chips C carried thereon may be supplied by the charging battery module and the external power supply apparatus via the receiving antenna (the power supply component 4). In the embodiment in which the power supply component 4 includes the receiving antenna, the power supply component 4 may be not exposed outside the chip testing device 1, but buried in the circuit board 10 or hidden in the chip testing device 1. In addition, the number of the power supply components 4 provided on the chip testing device 1 may be changed as required and is not limited to one; and there may be two or more power supply components 4.

Figure 5:
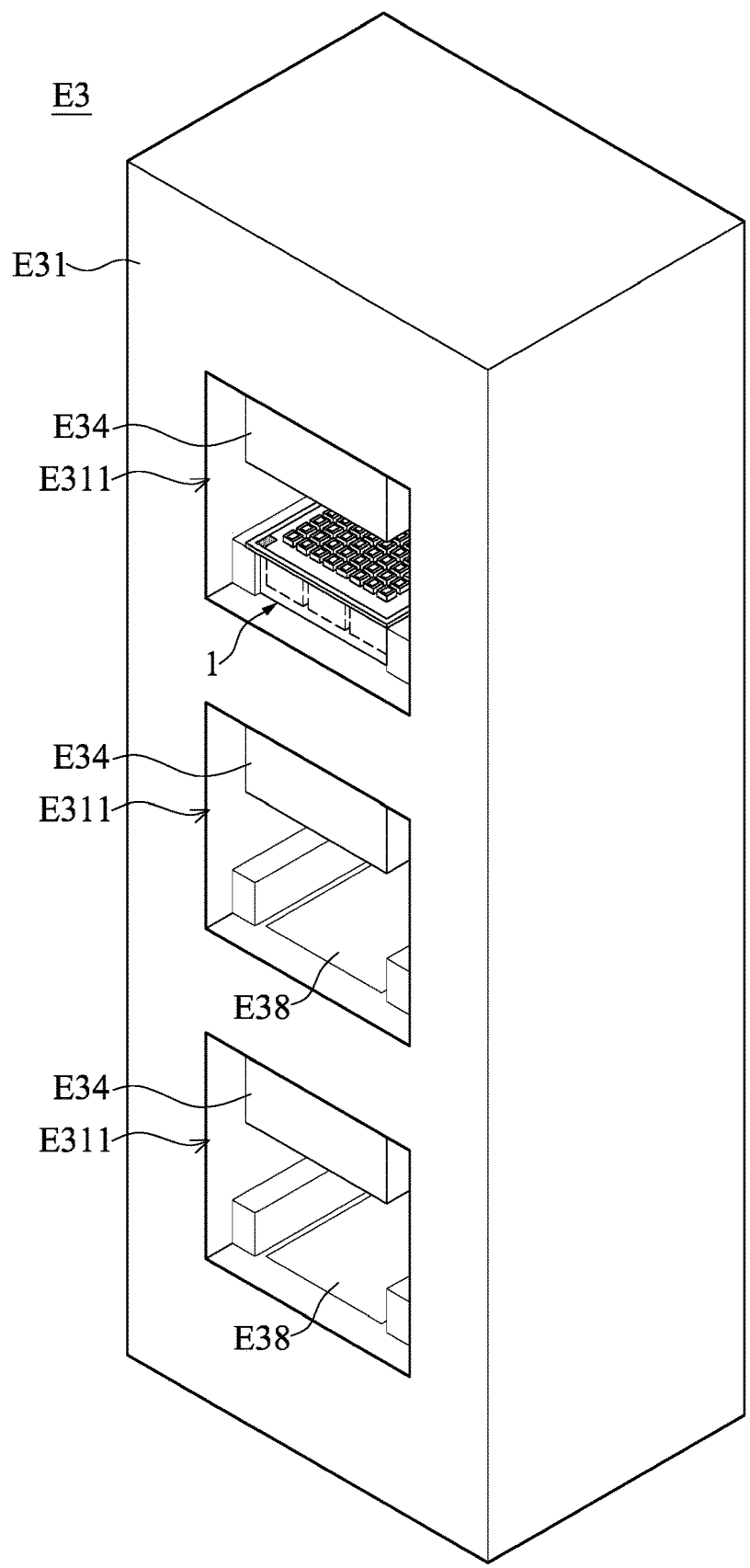
FIG. 5 is a schematic view of an environmental control apparatus of the chip testing system disclosed in an embodiment of the present disclosure.

As shown in FIGS. 3, 4, and 5, it should be particularly noted that the chip testing device 1 may further include a plurality of first data transmission terminals 8. The environmental control apparatus E3 includes an apparatus main body E31, a plurality of lifting devices E38, a plurality of accommodation chambers E311, and a plurality of temperature adjusting devices E34. Each accommodation chamber E311 is provided with one lifting device E38, and may be correspondingly provided with a plurality of second data transmission terminals. The plurality of first data transmission terminals 8 and the plurality of second data transmission terminals can mutually contact and exchange information. In practical application, each first data transmission terminal 8 and each second data transmission terminal may be of, for example, a Pogo pin or a reed-like structure, but the present disclosure is not limited thereto. The numbers and positions of the first data transmission terminals 8 and the second data transmission terminals may be changed as required, which are not limited herein.

In different embodiments, the chip testing device 1 may also include at least one first data transmission antenna (not shown in the figure), and the accommodation chamber E311 may correspondingly have at least one second data transmission antenna (not shown in the figure) provided therein. The first data transmission antenna and the second data transmission antenna can interact with each other and exchange information in a wireless manner. In practical application, the position of the first data transmission antenna is not limited to the inside of the accommodation chamber E311. Provided that the first data transmission antenna can exchange information with the second data transmission antenna disposed in the accommodation chamber E311, the first data transmission antenna may be disposed on any position in the environmental control apparatus E3.

Referring to FIGS. 1 and 3 again, in practical application, the chip testing system E may further include two image capturing units E91 and E92 which are connected to the central control device E1. The image capturing unit E91 is disposed near the chip mounting apparatus E2. The chip mounting apparatus E2 is used to dispose the chip C onto the chip testing device 1, and the image capturing unit E91 is used to capture an image of the chip testing device 1 and the chip C carried by the chip testing device 1. The central control device E1 receives image information captured by the image capturing unit E91, and then may determine whether or not the chip C is accurately mounted on the chip testing device 1. If determining that the chip C is inaccurately mounted on the chip testing device 1, the central control device E1 may control the chip mounting apparatus E2 to remount the chip C.

The image capturing unit E92 is disposed near the classification apparatus E5, and is used to capture an image of chips C in a defective product zone or a non-defective product zone. The central control device E1 can receive the image captured by the image capturing unit E92, so as to determine whether or not each chip C is accurately mounted (for example, on the tray). If determining that the chip C is inaccurately mounted, the central control device E1 may control the classification apparatus E5, a nearby mechanical arm, or the chip mounting apparatus E2 to remount the chip C.

Referring to FIGS. 1 and 2 again, the transfer apparatus E4 is surrounded by the plurality of environmental control apparatuses E3, and is used to convey the chip testing device 1. The transfer apparatus E4 may include a mechanical arm and a holding assembly, and the holding assembly is used to tightly hold the chip testing device 1. The central control device E1 is connected to the transfer apparatus E4, and is able to control the transfer apparatus E4 to convey the chip testing device 1 carrying multiple chips C into any accommodation chamber E311 of any environmental control apparatus E3 (as shown in FIG. 5). Accordingly, the transfer apparatus E4 may also be controlled by the central control device E1 to move the chip testing device 1 disposed in any accommodation chamber E311 out of the accommodation chamber E311.

The classification apparatus E5 is connected to the central control device E1, and may be controlled by the central control device E1 to detach the multiple chips C from the multiple sockets 2 of the chip testing device 1. The classification apparatus E5 may further place each chip C onto a tray in a non-defective product zone A1 or a tray in a defective product zone A2 according to a test result of the predetermined test program for the chip C. The classification apparatus E5 may include a mechanical arm. In an embodiment in which the classification apparatus E5 adjoins the chip mounting apparatus E2, the chip mounting apparatus E2 and the classification apparatus E5 may share the same mechanical arm. In practical application, the non-defective product zone A1 may be divided into a plurality of regions as required. The classification apparatus E5 may place the chips C in the different regions of the non-defective product zone A1 according to test results of the predetermined test program for the chips C. For example, the chips C are disposed in the different regions according to operating efficiency of the chips C.

Referring to FIG. 1 again, the chip testing system E of the present disclosure may further include a pre-test apparatus E6 which is connected to the central control device E1. The pre-test apparatus E6 may include at least one socket which is used to carry one chip C. The pre-test apparatus E6 can perform an open/short test and a leakage test on the chip C. In a specific application, the pre-test apparatus E6 may include a chip testing device 1 as shown in FIG. 3, and carry out a test on the chip C by using the included chip testing device 1 as shown in FIG. 3.

In practical application, the pre-test apparatus E6 may be disposed between a tray loading apparatus E7 and the chip mounting apparatus E2, and at least one mechanical arm may be disposed between the pre-test apparatus E6, the tray loading apparatus E7, and the chip mounting apparatus E2. The mechanical arm may detach a memory (chip) from a tray of the tray loading apparatus E7 and then place it in a socket of the pre-test apparatus E6. If the memory (chip) passes the open/short test and the leakage test, the mechanical aim detaches the chip and mounts it in a socket 2 of the chip testing device 1 disposed on the chip mounting apparatus E2; or if the memory (chip) does not pass the open/short test and the leakage test, the mechanical arm places the memory (chip) in another defective product zone A3. In practical application, the chip mounting apparatus E2 and the pre-test apparatus E6 may use the same mechanical arm to transfer the chip, but the present disclosure is not limited thereto. In different embodiments, the chip mounting apparatus E2 and the pre-test apparatus E6 may each have a different mechanical arm. In addition, the chip testing system may use an image capturing unit in a position detection apparatus E8 to capture images of the multiple sockets and the multiple chips disposed therein, to generate captured image information.

In an embodiment in which the chip testing system is used to test a memory, specifically, NAND flash memory, the pre-test apparatus E6 provided with the above-described chip testing device 1 first performs the open/short test and the leakage test on a plurality of memories (namely, the above-described chips C), which can significantly improve the overall test efficiency. Specifically, the foregoing high temperature test, burn-in test, low temperature test, and room temperature test on the memories necessarily consume a lot of time. Therefore, by the pre-test apparatus E6 first performing preliminary screening on the memories, each socket 2 on the chip testing device 1 is guaranteed to be effectively utilized, thus avoiding a memory failing the open/short test and the leakage test from occupying the socket 2 in a subsequent test process. In different applications, in addition to the open/short test and the leakage test, the pre-test apparatus E6 may, as required, further perform a specific direct current (DC) electrical performance test on the memory and a reading operation (Read ID) on different positions on the memory.

Figure 6:
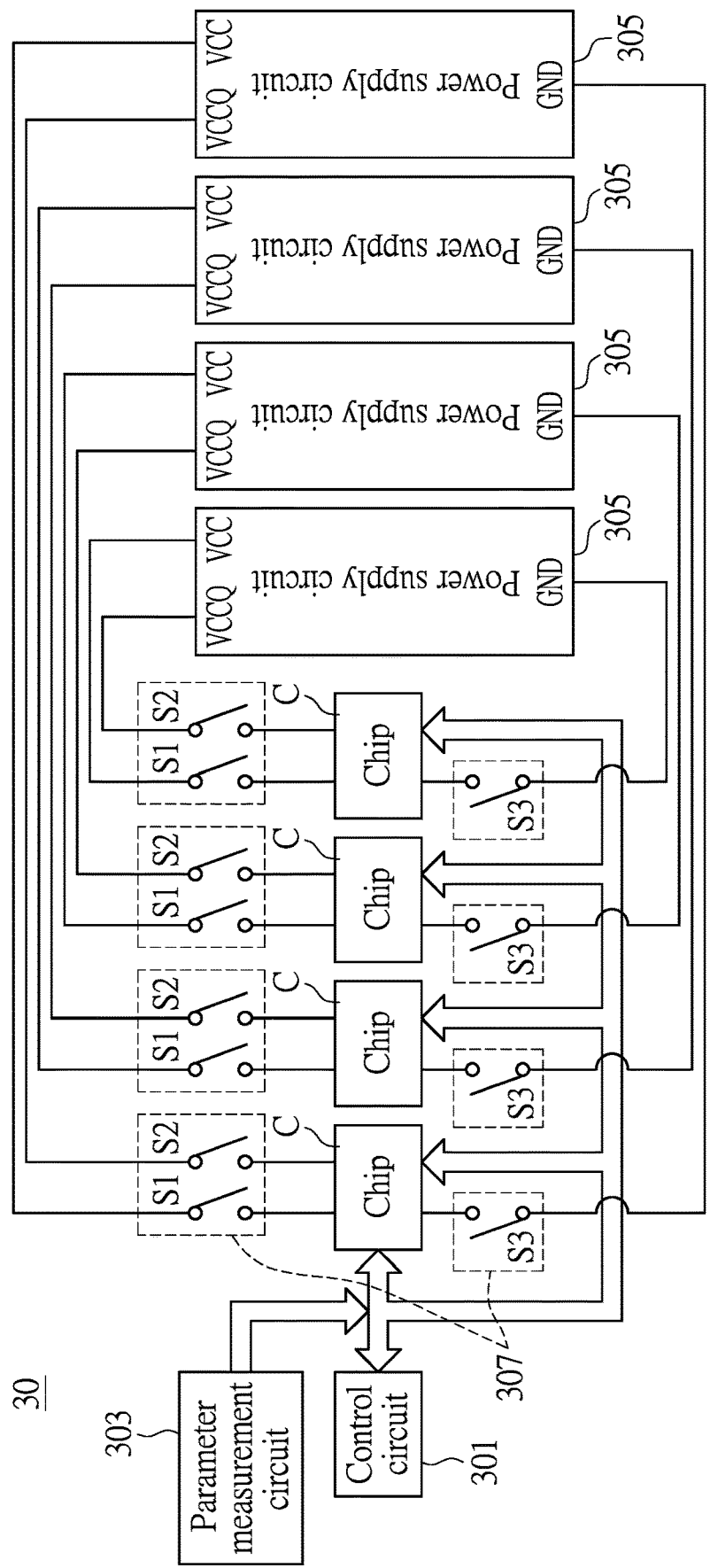
FIG. 6 is a schematic diagram of a chip testing circuit disclosed in an embodiment of the present disclosure.

Reference is made to FIG. 6, which is a schematic diagram of a chip testing circuit disclosed in an embodiment of the present disclosure. As shown in FIG. 6, the chip testing circuit 30 includes, for example, a control circuit 301, a parameter measurement circuit 303, a plurality of power supply circuits 305, and a plurality of switch circuits 307. The control circuit 301 is electrically connected to the chips C, the parameter measurement circuit 303, and the power supply circuits 305. Herein, the chips C are carried by the sockets 2 shown in FIG. 3 and are used for exemplary description below. The number of disposed elements shown in FIG. 6 is merely an example for description and is not intended to limit the present disclosure.

In an embodiment, signal pins of the chips C are mutually connected in parallel, and the control circuit 301 is connected in parallel to a plurality of signal pins of the plurality of chips C carried by the plurality of sockets 2, greatly reducing the number of pins required in a test. That is to say, the control circuit 301 can execute a burn-in test mode for the chips C simultaneously. The burn-in test mode described herein is, for example, a writing mode in which the control circuit 301 can output test data, so that the chips C simultaneously receive the test data; or the burn-in test mode is a reading mode in which test data is read from each individual chip at different times. In addition, the signal pin of the chip C is, for example, a control pin or a data pin.

Moreover, in this embodiment, the power supply circuits 305 and the chips C are identical in number, that is, each individual chip C is supplied with power by one power supply circuit 305. Further, the plurality of switch circuits 307 is electrically connected between the plurality of sockets 2 and the plurality of power supply circuits 305, and one switch circuit 307 is connected between each chip C and each power supply circuit 305. By controlling the switch circuit 307 to be turned on/off, the power supply circuit 305 is controlled whether to supply power to its corresponding chip C. For example, when the switch circuit 307 is turned on, the power supply circuit 305 can supply power to the chip C, while when the switch circuit 307 is turned off, the power supply circuit 305 stops supplying power to the chip C. In this embodiment, a turn-on mode of the switch circuits 307 is controlled by the control circuit 301. For example, according to operation requirements, the control circuit 301 may control the switch circuits 307 to be simultaneously turned on or off, or control some of them to be turned on.

In an embodiment, each power supply circuit 305, for example, outputs a first output voltage via a pin VCC and a second output voltage via a pin VCCQ. Each switch circuit 307, for example, includes a plurality of switch elements which may be electrically connected to the chip C via the corresponding socket 2. For example, this embodiment uses an example in which the switch circuit 307 includes a first switch element S1, a second switch element S2, and a third switch element S3. The first switch element S1 is electrically connected between the pin VCC of the power supply circuit 305 and a power-supply pin of the chip C; the second switch element S2 is electrically connected between the pin VCCQ of the power supply circuit 305 and the power-supply pin of the chip C; and the third switch element S3 is electrically connected between a grounding pin of the power supply circuit 305 and the power-supply pin of the chip C. Therefore, when the first switch element S1, the second switch element S2, and the third switch element S3 are all turned on, the corresponding chip C can acquire the electric power supplied by the power supply circuit 305. Herein, the first switch element S1, the second switch element S2, and the third switch element S3 are, for example, semiconductor switch elements. In another embodiment, the switch circuit 307 may have only the first switch element S1 and the second switch element S2, and does not have the third switch element S3 provided therein.

Figure 7:
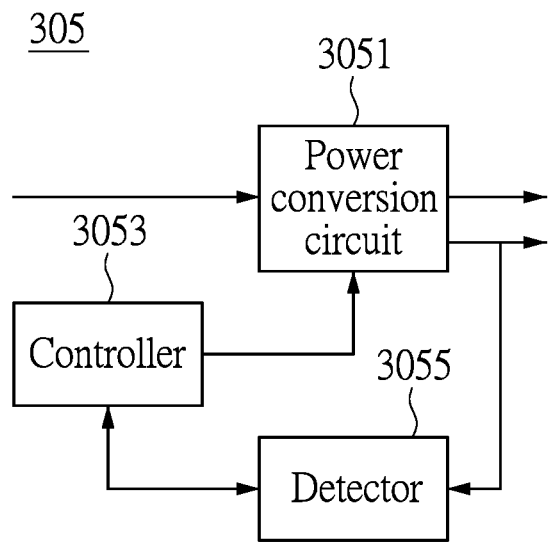
FIG. 7 is a schematic diagram of a power supply circuit disclosed in an embodiment of the present disclosure.

Referring to FIGS. 6 and 7 together, FIG. 7 is a schematic diagram of a power supply circuit disclosed in an embodiment of the present disclosure. Herein, the power supply circuit 305 includes, for example, a power conversion circuit 3051, a controller 3053, and a detector 3055, where the controller 3053 is electrically connected to the power conversion circuit 3051 and the detector 3055. Further, the power conversion circuit 3051 can receive an input voltage and convert the input voltage into a voltage, such as a first output voltage or a second output voltage, for the chip C to use. A specific operation manner of the power conversion circuit 3051 is known to persons of ordinary skill in the art, so the details are not described herein again. One end of the detector 3055 is electrically connected to an output end of the power conversion circuit 3051. Herein, the detector 3055 is electrically connected to, for example, an end of the power conversion circuit 3051 which outputs the first output voltage, but the present disclosure is not limited thereto.

When power output by the power conversion circuit 3051 is supplied to the chip C, actual working power of the chip C may have a deviation due to element processing or other factors, and a voltage provided by the power conversion circuit 3051 to the chip C may have a deviation. In order to protect relevant elements from damage caused by an excessively large voltage or current deviation, the detector 3055 may be used to effectively detect power usage of the power conversion circuit 3051 and report a detection result to the controller 3053. The controller 3053 may control, according to the detection result from the detector 3055, the power conversion circuit 3051 whether or not to continuously supply power to the chip C.

For example, the detector 3055 may detect whether or not a power consumption of the chip C exceeds a preset value. When learning, according to a detection result from the detector 3055, that the power consumption of the chip C already exceeds the preset value, the controller 3053 may control the power conversion circuit 3051 to stop outputting power to the chip C. Alternatively, when learning, according to the detection result from the detector 3055, that the power consumption of the chip C does not exceed the preset value, the controller 3053 may control the power conversion circuit 3051 to continuously and normally output power to the chip C. FIG. 7 uses an example in which the detector 3055 is a voltage detector. When the voltage detector detects that the first output voltage exceeds a preset voltage value, the controller 3053 controls the power conversion circuit 3051 to stop outputting power to the chip C.

In another embodiment, the detector 3055 may also be a current detector. When the detector 3055 is a current detector, the current detector is electrically connected between a power-supply loop of the chip C and a grounding terminal thereof. When the current detector detects that a current consumption of the chip C exceeds a preset current value, the controller 3053 controls the power conversion circuit 3051 to stop outputting power to the chip C.

In an embodiment, the control circuit 301 may execute a parametric test mode or a burn-in test mode for the chips C. Herein, the parametric test mode refers to that the control circuit 301 performs an electrical performance test, for example, DC electrical performance tests such an open/short test and a leakage test, separately on each chip C via the parameter measurement circuit 303. The control circuit 301 may further learn a status of each chip C according to a test result of the parameter measurement circuit 303, and accordingly classify the chip C as a non-defective product or a defective product. A specific manner of performing the electrical performance test by the parameter measurement circuit 303 is a technique known to persons skilled in the art, and the details are not described herein again.

Further, when executing the parametric test mode, the control circuit 301 controls one of the switch circuits 307 to be turned on, and then controls the parameter measurement circuit 303 to perform the electrical performance test on a chip C connected to the turned-on switch circuit 307. The parameter measurement circuit 303 performs the electrical performance test on the chips successively in such a manner, until the electrical performance tests for all the chips are finished. Finally, the control circuit 301 may learn an electrical performance test status of each chip C, and accordingly classify the chip C as a non-defective product or a defective product.

Moreover, when the signal pins of the chips C are mutually connected in parallel, the chip testing circuit 30 in this embodiment can still control power supply to each chip C individually. Therefore, when it is required to perform a parametric test on one of the chips C, it is only required to supply power individually to the chip C to be tested, while the remaining chips C are not supplied with power. Thus, the parameter measurement circuit 303 can successfully and accurately perform the electrical performance test on the chip C to be tested. That is to say, by using the foregoing test manner, the present disclosure not only can effectively reduce the number of pins required in testing the chips C, but also can normally perform the electrical performance test on the chips C, without being affected by the reduction in the number of the test pins.

In an embodiment, when the control circuit 301 executes a burn-in test mode, the burn-in test mode herein includes a writing test and a reading test. When performing the writing test, the control circuit 301 controls all the switch circuits 307 to be turned on, so that all the chips C can acquire power supply and operate. Because the control circuit 301 is connected in parallel to all the chips C, after outputting test data, the control circuit 301 can write the test data into all the chips C simultaneously, to complete the writing test.

When performing the reading test, the control circuit 301 reads test data in the chips C one by one and makes identification. For example, the control circuit 301 controls a switch circuit 307 corresponding to a chip C to be read to be turned on, and controls switch circuits 307 corresponding to other chips C not to be read to be turned off. In this way, the control circuit 301 can read only test data in the chip C to be read. For other chips C which have not been read, the control circuit 301 can read test data therein one by one in this manner, to complete the reading test for all the chips C. Finally, the control circuit 301 can determine each chip C as a non-defective product or a defective product according to a reading status of the chip C.

In another embodiment, when performing the reading test, the control circuit 301 may also control all the switch circuits 307 to be turned on, and read test data in the chips one by one. Further, the control circuit 301 outputs a signal to suppress a data output status of the chips which have not been read. That is to say, test data in only one of the chips can be read by the control circuit each time, while test data in other chips cannot be read by the control circuit at the same time. Further, in this embodiment, data channels (for example, DQ) in the chips are sequentially connected in series, but the present disclosure is not limited thereto.

Figure 8:
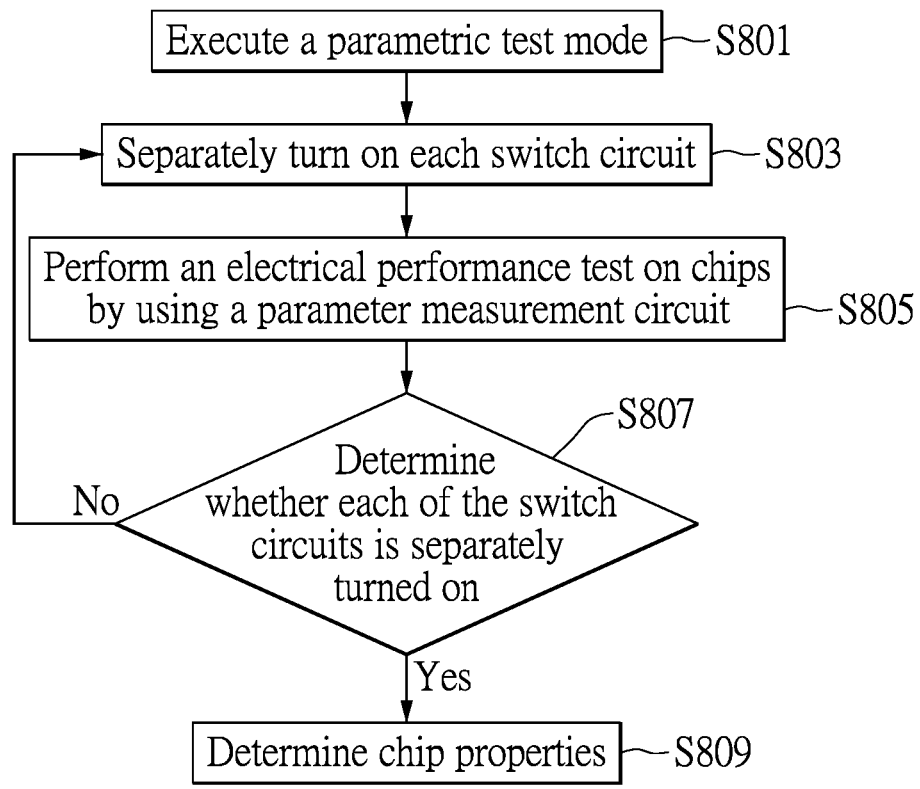
FIG. 8 is a flowchart of a chip testing method by means of a parametric test disclosed in an embodiment of the present disclosure.

Referring to FIG. 8, FIG. 8 is a flowchart of a chip testing method by means of a parametric test disclosed in an embodiment of the present disclosure. A process shown in FIG. 8 is described below and reference is further made to FIG. 6.

In step S801, a parametric test mode is executed. The control circuit 301 may start a chip testing circuit 30 according to operations to execute the parametric test mode, to perform an electrical performance test on each chip C.

In step S803, each switch circuit 307 is turned on separately. The control circuit 301 controls only one of the switch circuits 307 to be turned on, so as to individually supply power to a chip C to be subjected to the electrical performance test, and stop power supply to other chips C not to be subjected to the electrical performance test.

In step S805, an electrical performance test is performed on the chip C by using the parameter measurement circuit 303. After one single switch circuit 307 is turned on, the control circuit 301 controls the parameter measurement circuit 303 to perform a DC electrical performance test, such as an open/short test and a leakage test, on the chip C which is individually supplied with power.

In step S807, the control circuit 301 determines whether or not each of the switch circuits 307 is turned on separately. If a judgment result of step S807 is no, the process returns to step S803 to continuously perform corresponding operations.

In step S809, chip properties are determined. If a judgment result of step S807 is yes, it indicates that all the switch circuits 307 are individually turned on and the parameter measurement circuit 303 already finishes the electrical performance test on each chip C. Therefore, the control circuit 301 can further classify each chip C as a non-defective product or a defective product according to a result of the electrical performance test for the chip C.

Figure 9:
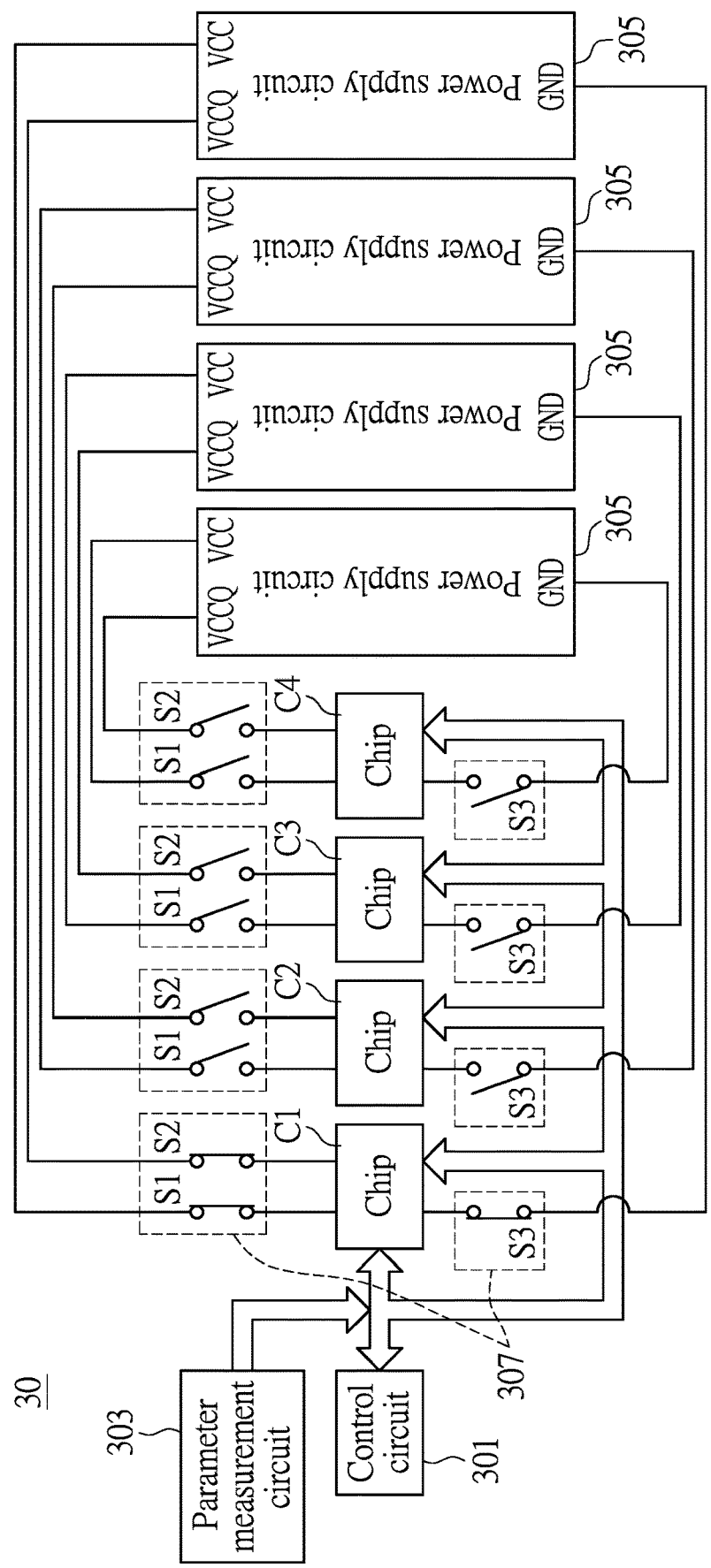
FIGS. 9, 10, 11, and 12 are schematic diagrams showing switch circuits of the chip testing circuit being separately turned on in an embodiment of the present disclosure.
Figure 10:
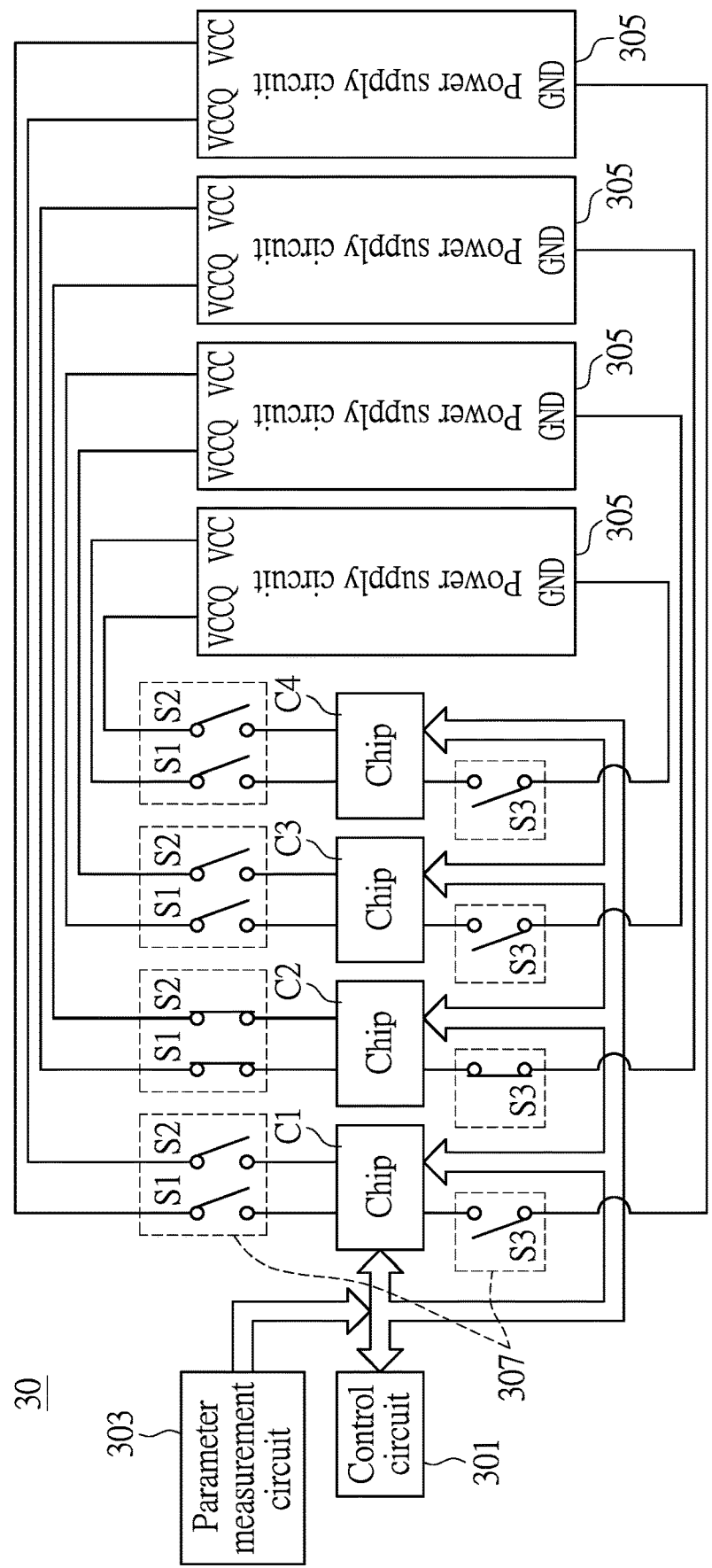
Figure 11:
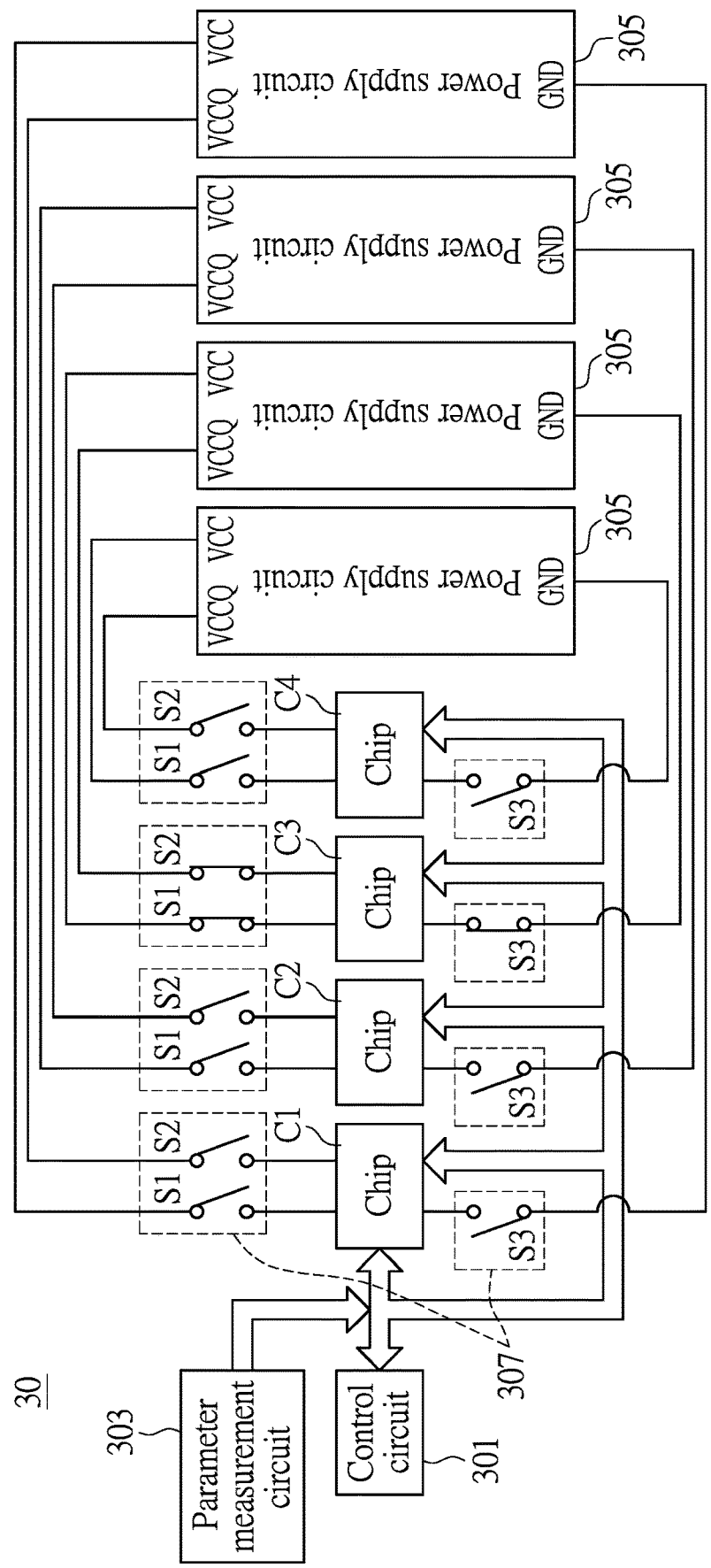
Figure 12:
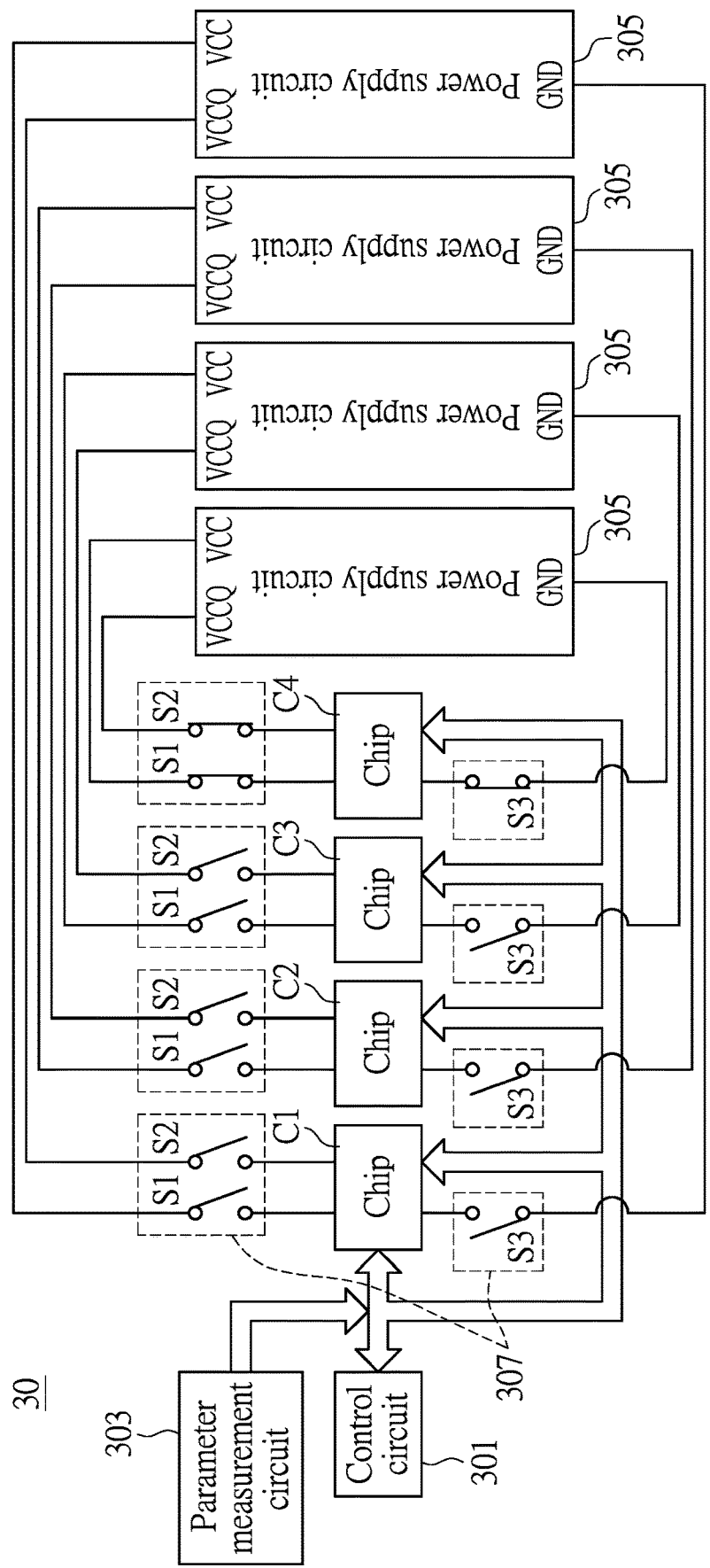

In addition, for practical execution manners of steps S803 to step S807 in FIG. 8, reference may be made to FIGS. 9, 10, 11, and 12, which are schematic diagrams showing that switch circuits of the chip testing circuit are separately turned on in an embodiment of the present disclosure. FIG. 9 shows that a switch circuit 307 electrically connected to a chip C1 is turned on, while switch circuits 307 electrically connected to the remaining chips C2 to C4 are turned off. FIG. 10 shows that a switch circuit 307 electrically connected to a chip C2 is turned on, while switch circuits 307 electrically connected to the remaining chips C1, C3 and C4 are turned off. FIG. 11 shows that a switch circuit 307 electrically connected to a chip C3 is turned on, while switch circuits 307 electrically connected to the remaining chips C1, C2 and C4 are turned off. FIG. 12 shows that a switch circuit 307 electrically connected to a chip C4 is turned on, while switch circuits 307 electrically connected to the remaining chips C1 to C3 are turned off. In such a manner of controlling the switch circuits 307, the control circuit 301 can perform the electrical performance test separately on the chips C one by one.

Figure 13:
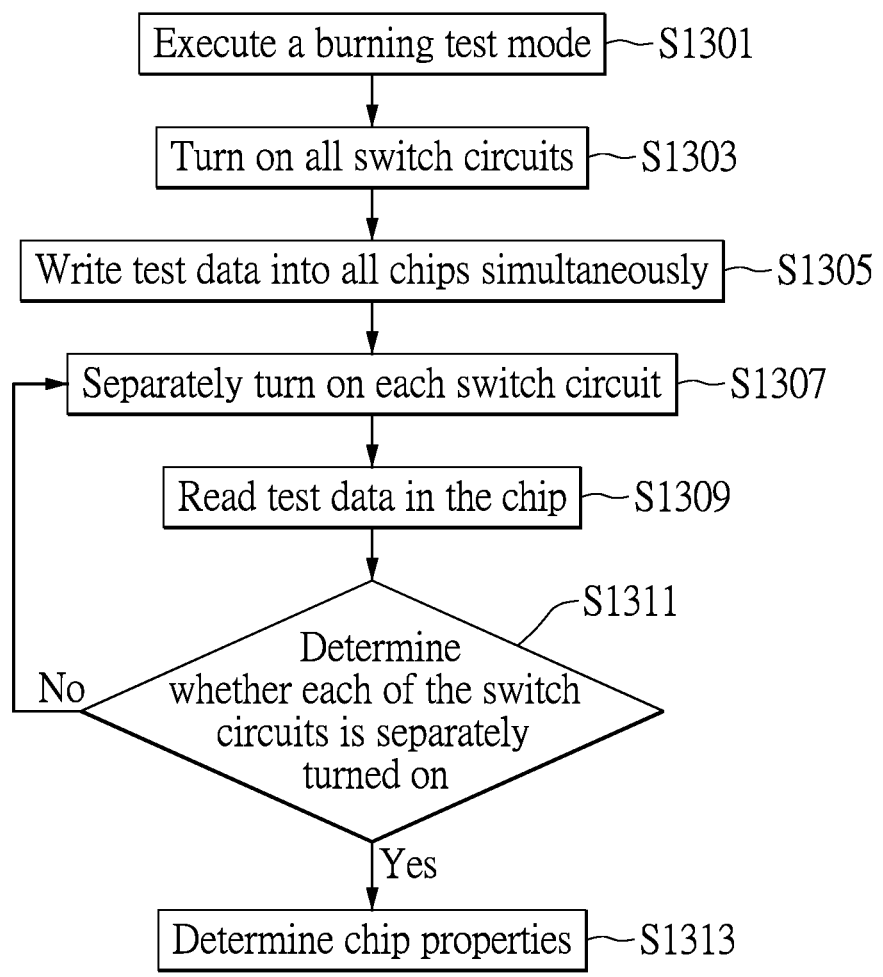
FIG. 13 is a flowchart of a chip testing method by means of a burn-in test disclosed in an embodiment of the present disclosure.

Referring to FIG. 13, FIG. 13 is a flowchart of a chip testing method by means of a burn-in test disclosed in an embodiment of the present disclosure. A process shown in FIG. 13 is described below and reference is also made to FIG. 6.

In step S1301, a burn-in test mode is executed. The control circuit 301 may start a chip testing circuit 30 according to operations to execute the burn-in test mode, to perform a writing test and a reading test of the burn-in test mode on each chip C.

In step S1303, all the switch circuits 307 are turned on. The control circuit 301 controls all the switch circuits 307 to be turned on, so that all the chips C1 can acquire power supply from the power supply circuits 305 and operate.

In step S1305, test data is written into all the chips C simultaneously. The control circuit 301 outputs test data and then writes the test data into all the chips C simultaneously, to complete the writing test.

In step S1307, each switch circuit 307 is turned on separately. After the foregoing writing test is completed, the control circuit 301 controls only one of the switch circuits 307 to be turned on, so as to individually supply power to a chip C to be subjected to the reading test and stop power supply to other chips C not to be subjected to the reading test.

In step S1309, the test data in the chip C is read. The control circuit 301 reads test data in the chip C which individually acquires power supply.

In step S1311, the control circuit 301 determines whether or not each of the switch circuits is turned on separately. If a judgment result of step S1311 is no, the process returns to step S1307 to continuously perform corresponding operations.

In step S1313, chip properties are determined. If a judgment result of step S1313 is yes, it indicates that all the switch circuits 307 are individually turned on and the control circuit 301 already completes reading the test data written into each chip C. Then, the control circuit 301 may determine whether or not the test data read from each chip C is consistent with the test data written into the chip in step S1305 by comparison, if yes, determine that the chip C is a non-defective product; if not, determine that the chip C is a defective product.

Figure 14:
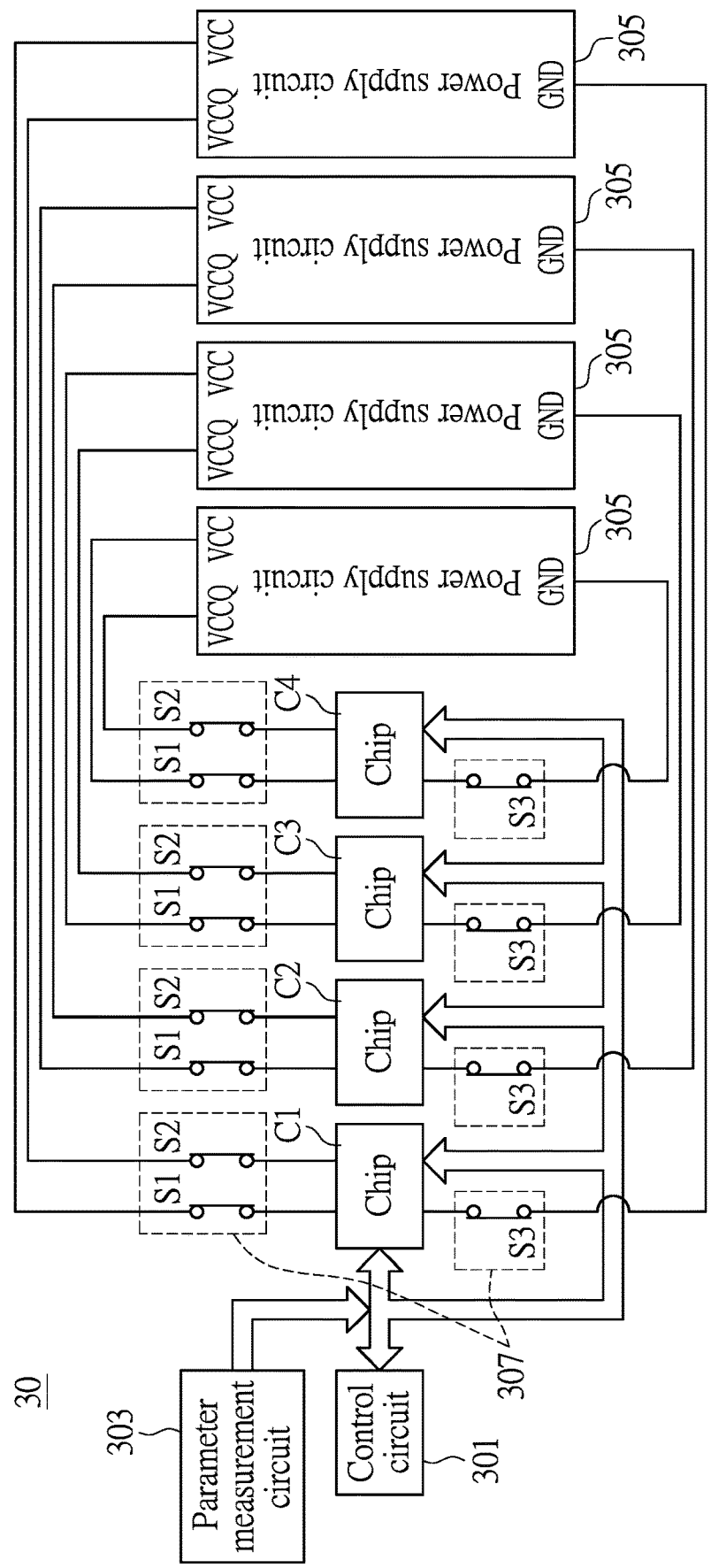
FIG. 14 is a schematic diagram showing switch circuits of the chip testing circuit being all turned on in an embodiment of the present disclosure.

For an execution manner of the writing test in step S1303 in FIG. 13, reference may be made to FIG. 14 which is a schematic diagram showing that switch circuits of the chip testing circuit are all turned on in an embodiment of the present disclosure. In FIG. 14, the switch circuits 307 electrically connected to the chips C1 to C4 are all turned on. In such a manner of controlling the switch circuits 307, the control circuit 301 can write test data into the chips C simultaneously.

In addition, for an execution manner of the reading test in steps S1307 to S1311 in FIG. 13, reference may be made to FIGS. 9, 10, 11, and 12. In such a manner of controlling the switch circuits 307, the control circuit 301 can read the test data from each individual chip at different times.

Figure 15:
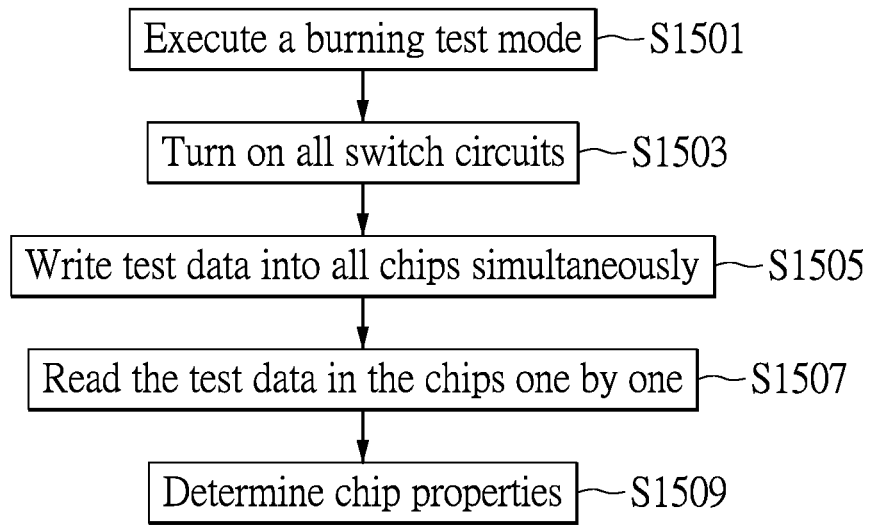
FIG. 15 is a flowchart of a burn-in test of a chip testing method disclosed in an embodiment of the present disclosure.

Referring to FIG. 15, FIG. 15 is a flowchart of a chip testing method by means of a burn-in test disclosed in an embodiment of the present disclosure. A process shown in FIG. 15 is described below and reference is also made to FIG. 6.

In step S1501, a burn-in test mode is executed. The control circuit 301 may start a chip testing circuit 30 according to operations to execute the burn-in test mode, to perform a writing test and a reading test of the burn-in test mode on each chip C.

In step S1503, all the switch circuits 307 are turned on. The control circuit 301 controls all the switch circuits 307 to be turned on, so that all the chips C can acquire power supply from the power supply circuits 305 and operate.

In step S1505, the test data is written into the chips C simultaneously. The control circuit 301 outputs the test data and then writes the test data into all the chips C simultaneously, to complete the writing test.

In step S1507, the test data in the chips is read one by one. After writing of the test data into all the chips is completed, the control circuit can perform the reading test. Herein, the reading test is that the control circuit reads the test data in the chips one by one at different times. That is, test data in only one of the chips can be read by the control circuit each time, while test data in other chips cannot be read by the control circuit at the same time. The control circuit reads the test data in all the chips in such a manner to complete the reading test.

In step S1509, chip properties are determined. The control circuit 301 may determine whether or not the test data read from each chip C is consistent with the test data written into the chip in step S1505 by comparison; and if yes, determine that the chip C is a non-defective product, or if not, determine that the chip C is a defective product.

Step S1505 is execution of the writing test of the burn-in test mode on the chips C, and step S1507 is execution of the reading test of the burn-in test mode on the chips C. In the two steps, all the switch circuits are turned on, that is, all the chips can acquire power supply. However, it should be noted that, when step S1505 is executed, test data is written into all the chips simultaneously. When step S1507 is executed, test data is read from each individual chip at different times.

In an embodiment, when step S1507 is executed, data channels (for example, DQ) in the chips are sequentially connected in series. By using FIG. 14 as an example for description, a data channel of the chip C1 and that of the chip C2 are connected in series, the data channel of the chip C2 and that of the chip C3 are connected in series, and the data channel of the chip C3 and that of the chip C4 are connected in series.

Therefore, at a first time, when the control circuit is required to read the test data in the chip C1, the channel of the chip C1 is controlled to be in an enabled and readable state by the control circuit, while channels of the remaining chips C2 to C4 are in a disabled and unreadable state. Afterwards, at a second time, when the control circuit is required to read the test data in the chip C2, the channel of the chip C2 is controlled to be in an enabled and readable state by the control circuit, while channels of the remaining chips C1, C3 and C4 are in a disabled and unreadable state. Afterwards, at a third time, when the control circuit is required to read the test data in the chip C3, the channel of the chip C3 is controlled to be in an enabled and readable state by the control circuit, while channels of the remaining chips C1, C2 and C4 are in a disabled and unreadable state. Afterwards, at a fourth time, when the control circuit is required to read the test data in the chip C4, the channel of the chip C4 is controlled to be in an enabled and readable state by the control circuit, while channels of the remaining chips C1 to C3 are in a disabled and unreadable state.

It should be further noted that, the parametric test mode is executed before the burn-in test mode. Thus, by first executing the parametric test mode, defective products are screened out from the chips. Then, the burn-in test mode is executed for non-defective chips which are selected after screening by the parametric test mode. In this way, the overall test efficiency can be improved, and the accuracy of a final chip test result can be greatly enhanced by tests in different phases.

Moreover, it should be noted that, when the parametric test mode or the burn-in test mode is executed, in addition to supplying power to the chip C, the power supply circuit 305 also detects power usage of the chip C, and may actively stop power supply to the chip C when detecting an abnormity (for example, an abnormal voltage or current). Such a circuit protection mechanism can effectively protect relevant elements in the chip testing circuit 30, and can further guarantee normal execution of the parametric test mode or the burn-in test mode.

To sum up, compared with the existing chip testing apparatus, the chip testing circuit and the testing method thereof disclosed in the present disclosure are superior both in cost effectiveness and test efficiency. Moreover, by an innovative control of power supply, when signal pins of all chips are connected in parallel, each individual chip can be controlled to acquire power supply, and an electrical performance test can be successfully performed on the chip separately. Further, by an active power protection mechanism, the present disclosure can protect elements of the chip testing circuit from being damaged. In this way, the present disclosure can effectively reduce the number of test pins and can further obtain an accurate test result.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip testing circuit, adapted for testing a plurality of chips carried by a plurality of sockets, the chip testing circuit comprising:
a parameter measurement circuit used to perform an electrical performance test on the plurality of chips carried by the plurality of sockets;
a plurality of power supply circuits electrically connected to the plurality of sockets, respectively, and used to supply power to the plurality of chips carried by the plurality of sockets, wherein any of the power supply circuits is individually connected to one of the sockets;
a plurality of switch circuits electrically connected between the plurality of sockets and the plurality of power supply circuits, wherein any of the switch circuits is electrically connected between one of the sockets and one of the power supply circuits; and
a control circuit used to control operations of the parameter measurement circuit and the plurality of power supply circuits, and connected in parallel to a plurality of signal pins of the plurality of chips carried by the plurality of sockets, so that after the control circuit outputs test data, the chips simultaneously receive the test data;
wherein when executing a parametric test mode, the control circuit controls one of the switch circuits to be turned on and then controls the parameter measurement circuit to perform an electrical performance test on one of the plurality of chips connected to the switch circuit that is turned on.

2. The chip testing circuit of claim 1, wherein the power supply circuit includes: a power conversion circuit, used to receive an input voltage and convert the input voltage into a first output voltage for the chip to use in operation;
a detector, used to detect power usage of the chip; and
a controller, electrically connected to the power conversion circuit and the detector; and used to control, according to a detection result from the detector, the power conversion circuit to output the first output voltage.

3. The chip testing circuit of claim 2, wherein when the detector detects that a power consumption of the chip exceeds a preset value, the controller controls the power conversion circuit to stop outputting the first output voltage.

4. The chip testing circuit of claim 2, wherein the detector is a current detector or a voltage detector.

5. The chip testing circuit of claim 2, wherein when performing a writing test of a burn-in test mode, the control circuit controls each of the switch circuits to be turned on simultaneously and writes the test data to each of the chips simultaneously.

6. The chip testing circuit of claim 5, wherein after writing the test data to all the chips, the control circuit performs a reading test of the burn-in test mode, so as to read the test data in the chips one by one for verification.

7. The chip testing circuit of claim 6, wherein when performing the reading test of the burn-in test mode, the control circuit controls each of the switch circuits to be turned on separately, so as to separately read the test data in the corresponding chip connected to the switch circuit that is turned on for verification.

8. The chip testing circuit of claim 5, wherein when the control circuit performs the reading test of the burn-in test mode, data reading channels of the chips are sequentially connected in series, and the channels of the chips are controlled by the control circuit to be in an enabled and readable state or a disabled and unreadable state, so that only the test data in one of the chips is read by the control circuit at a time, while the test data in the other chips is not read by the control circuit at the same time.

9. The chip testing circuit of claim 1, wherein any of the switch circuits includes a plurality of switch elements electrically connected between the power supply circuit and the socket.

10. The chip testing circuit of claim 9, wherein the plurality of switch elements includes a first switch element, a second switch element, and a third switch element; the first switch element is electrically connected between a power-supply pin of the power conversion circuit that outputs the first output voltage and a power-supply pin of the chip; the second switch element is electrically connected between a power-supply pin of the power conversion circuit that outputs a second output voltage and the power-supply pin of the chip; and the third switch element is electrically connected between a grounding pin of the power conversion circuit and the power-supply pin of the chip.

11. The chip testing circuit of claim 10, wherein the switch elements are semiconductor switch elements.

12. The chip testing circuit of claim 1, wherein the electrical performance test provided by the parameter measurement circuit is an open/short test and a leakage test.

13. A chip testing method, applicable for testing a plurality of chips carried by a plurality of sockets, wherein the plurality of sockets is electrically connected to a plurality of power supply circuits, respectively, any of the power supply circuits being individually connected to one of the sockets; a plurality of switch circuits is electrically connected between the plurality of sockets and the plurality of power supply circuits, any of the switch circuits being electrically connected between one of the sockets and one of the power supply circuits; and a control circuit is connected in parallel to a plurality of signal pins of the plurality of chips carried by the plurality of sockets; the method comprising:
when executing a parametric test mode, controlling, by the control circuit, one of the switch circuits to be turned on;
when one of the switch circuits is turned on, controlling, by the control circuit, a parameter measurement circuit to perform an electrical performance test on one of the plurality of chips connected to the switch circuit that is turned on; and
determining, by the control circuit according to a result of the electrical performance test, whether the chip is a non-defective product or a defective product.

14. The chip testing method of claim 13, further comprising:
when outputting a first output voltage to the chip for use, determining, by the power supply circuit, a power consumption of the chip;
when the power consumption of the chip exceeds a preset value, stopping, by the power supply circuit, outputting the first output voltage; and
when the power consumption of the chip does not exceed the preset value, normally outputting, by the power supply circuit, the first output voltage.

15. The chip testing method of claim 13, further comprising:
when performing a writing test in a burn-in test mode, controlling, by the control circuit, each of the switch circuits to be turned on simultaneously and writing the test data to each chip simultaneously.

16. The chip testing method of claim 15, further comprising:
after writing the test data to all of the chips, performing, by the control circuit, a reading test of the burn-in test mode, so as to read the test data in the chips one by one for verification; and
determining, by the control circuit according to a verification result of the test data, whether the chip is a non-defective product or a defective product.

17. The chip testing method of claim 16, wherein when performing the reading test of the burn-in test mode, the control circuit controls each of the switch circuits to be turned on separately, so as to separately read the test data in the corresponding chip connected to the switch circuit that is turned on for verification.

18. The chip testing method of claim 16, wherein when the control circuit performs the reading test of the burn-in test mode, data reading channels of the chips are sequentially connected in series, and the channels of the chips are controlled by the control circuit to be in an enabled and readable state or a disabled and unreadable state, so that only test data in one of the chips is read by the control circuit at a time, while test data in the other chips is not read by the control circuit at the same time.

19. The chip testing method of claim 15, wherein the control circuit executes the burn-in test mode after finishing with the parametric test mode.

* * * * *